United States Patent [19]

Maejima et al.

[11] Patent Number: 4,783,225
[45] Date of Patent: Nov. 8, 1988

[54] WAFER AND METHOD OF WORKING THE SAME

[75] Inventors: Hisashi Maejima, Higashiyamato; Hiroshi Nishizuka, Higashikurume; Susumu Komoriya, Tokorozawa; Etuo Egashira, Yamanashi, all of Japan

[73] Assignee: Hitachi, Ltd., Tokyo, Japan

[21] Appl. No.: 830,754

[22] Filed: Feb. 19, 1986

Related U.S. Application Data

[63] Continuation of Ser. No. 741,107, Jun. 4, 1985, abandoned, which is a continuation of Ser. No. 517,405, Jul. 26, 1983, abandoned.

[30] Foreign Application Priority Data

Jul. 30, 1982 [JP] Japan .................. 57-131949

[51] Int. Cl.⁴ .................. H01L 21/02; H01L 29/06
[52] U.S. Cl. .................. 148/33.2; 437/249; 437/225; 357/55
[58] Field of Search .......... 51/283 E, 283 R, 281 SF; 148/33, 33.2; 437/225, 249; 357/55

[56] References Cited

U.S. PATENT DOCUMENTS

| | | | |
|---|---|---|---|
| 3,951,728 | 4/1976 | Egashira et al. | 156/600 |
| 4,228,937 | 10/1980 | Tocci | 225/96.5 |
| 4,256,229 | 3/1981 | Lee | 211/41 |
| 4,344,260 | 8/1982 | Ogiwara | 51/283 E |
| 4,488,930 | 12/1984 | Koe | 156/616 R |

FOREIGN PATENT DOCUMENTS

| | | | |
|---|---|---|---|
| 0060567 | 5/1977 | Japan | 29/583 |
| 53-38594 | 10/1978 | Japan . | |
| 0105638 | 8/1981 | Japan | 29/583 |
| 0043410 | 3/1982 | Japan | 29/583 |
| 922150 | 3/1963 | United Kingdom . | |
| 975960 | 11/1964 | United Kingdom . | |

OTHER PUBLICATIONS

"Silicon Wafers with Optimum Edge Rounding," *Solid State Technology*, pp. 16–17, May 1976.
Semiconductor Silicon Manufacturing and Machining Using Diamond Tools-G. Janus, Burghausen.
IBM Tecnical Disclosure Bulletin, vol. 22, No. 3 "Diagnostic Method for Locating the Wafer Position in a Crystal".
IBM Technical Disclosure Bulletin, vol. 11, No. 12, "Diffusion Boat".

*Primary Examiner*—Olik Chaudhuri
*Attorney, Agent, or Firm*—Antonelli, Terry & Wands

[57] ABSTRACT

A wafer having chamfered bent portions in the joint regions between the contour of the wafer and the cutaway portion of the wafer such as an orientation flatness. The chipping of the wafer can be prevented, and in coating the wafer with a photoresist, forming an epitaxially grown layer on the wafer, etc., films having desired characteristics can be provided on the surface of the wafer.

13 Claims, 9 Drawing Sheets

WAFER AND METHOD OF WORKING THE SAME

This is a continuation of application Ser. No. 741,107, filed June 4, 1985, abandoned, which is a continuation of Ser. No. 517,405 filed July 26, 1983, now abandoned.

BACKGROUND OF THE INVENTION

The present invention relates to a wafer and a method of working the same and more particularly, to a novel wafer and method of working the same which can prevent defects such as the chipping of the joint regions between the contour of the wafer and the cut-away portion of the wafer such as an orientation flatness.

In general, in the production of a semiconductor device such as a transistor, an integrated circuit (IC) or a large-scale integrated circuit (LSI), when foreign matter including dust, chipping etc. adhere on the surface of a wafer, which is a substantially circular flat members made of a semiconductor material such as silicon (Si), when subjecting the wafer to processing such as diffusion, coating with a resist, etching and evaporation, the foreign matter form causes for scratches in the wafer surface and for defects such as an nonuniform film thickness and drawbacks arise during transportation of the semiconductor device.

There are various causes for the appearance of such foreign matter. As one of the causes, it has been known that, for example, during the transportation of wafers the outer peripheral part of the wafer collides against any transport mechanism or the wafers come into contact with each other, whereby the outer peripheral part of the wafer itself breaks off locally. Chips resulting from the breakage adhere on the surface of the wafer, as the foreign matter, to incur various defects. In order to prevent the aforementioned breakage of the outer peripheral part of the wafer, in, for example, Japanese patent application publication No. 53-38594, both the major surfaces of the wafer outer-peripheral part have been chamfered by mechanical or chemical means.

However, it has been found that, even when both the major surfaces of the wafer outer-peripheral part are chamfered in this manner, the wafer nevertheless frequently chips.

As a result of research efforts into the cause of chipping, important facts have been revealed. In general, a wafer is formed with a flat portion called the "orientation flatness (principal flatness)" by cutting a part of the wafer rectilinearly, in order to indicate the crystal orientation of the wafer and also to position the wafer. The formation of such flat portion, however, results in forming acute bends in the joint parts between the flat portion and the contour of the wafer. Consequently, the joint part is liable to chipping. That is, during the transportation of the wafer, the joint part collides against the guide of an air bearing or comes into touch with another wafer, whereby this joint part breaks off to give rise to chipping.

As described above, the acute bends are formed in the joint parts between the flat portion as the orientation flatness and the contour of the wafer. In this regard, it has been found that a harmful phenomena occurs in the regions of the acute bends. In the processing of the wafer, when a photoresist film for a photolithographic process is formed on the surface of the wafer, crowns and fringes appear in the photoresist film. When a thin film such as an epitaxially vapor-grown layer is formed on the wafer surface, a film of abnormal thickness is formed due to, e.g., abnormal growth.

It is accordingly an object of the present invention to provide a wafer and a method of working the same which can prevent the appearance of foreign matter and the occurrence of other various defects attributed to the chipping of the joint regions between the contour of the wafer and the cut-away portion of the wafer such as an orientation flatness.

This invention can best be understood by reference to the following description taken in connection with the accompanying illustrative drawings.

DESCRIPTION OF THE PREFERRED EMBODIMENTS

Figure 1:
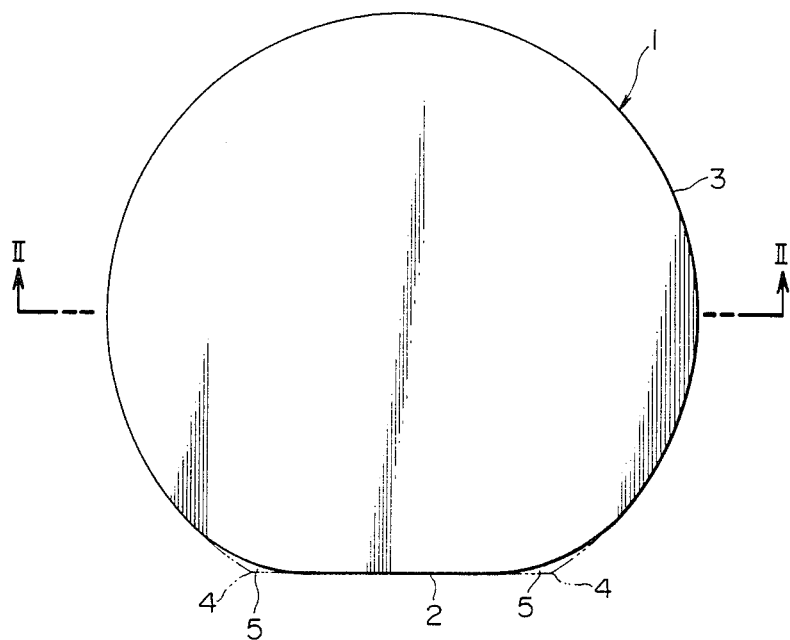
FIG. 1 is a plan view showing a semiconductor wafer which is an embodiment of the present invention.

Now, the present invention will be described in detail in connection with embodiments illustrated in the drawings.

Figure 2:
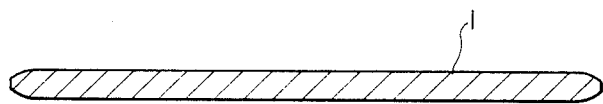
FIG. 2 is a sectional view taken along line II—II in FIG. 1.
Figure 3:
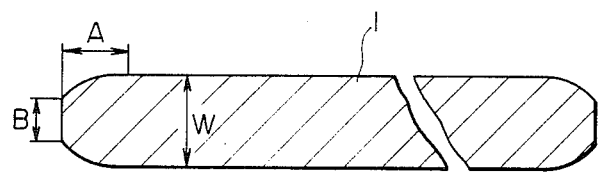
FIG. 3 is an enlarged view of FIG. 2.

Referring now to the drawings wherein like reference numerals are used throughout the various views to designate like parts and, more particularly, to FIGS. 1-3, according to these figures, a wafer 1 of this embodiment has, for example, a circular shape prepared by, for example, slicing an ingot of silicon (Si) whose sectional shape is substantially circular. In a part of the wafer 1, a principal flatness (flat) or orientation flatness or orientation flat (O. F.) 2 is formed to be rectilinear as a positioning removal portion for indicating the direction of a crystal axis and for positioning the wafer 1 in various processing.

As shown most clearly in FIG. 3, an outer peripheral portion 3 of the wafer 1 is, for example, arcuately chamfered.

Further, according to the wafer 1 of this embodiment, in the joint parts 4 between both the ends of the orientation flatness 2 and the contour of the wafer 1, corner regions indicated by two-dot chain lines are chamfered into the shape of circular arcs indicated by solid lines. Due to such structure, the wafer 1 is so constructed that the corner regions of the joint parts 4 are prevented from chipping during the various processing of the wafer 1, the chipping causing defects such as the appearance of foreign matter in the form of broken chipping pieces. More specifically, the chamfered regions 5 of the joint part 4 in the embodiment of FIG. 1 is a region enclosed with the solid line and the two-dot chain line. The inner edge of the chamfered region 5 is defined by the circular arc of a common inscribed circle which is inscribed to the contour of the wafer 1 and the orientation flatness 2.

In case of performing the arcuate chamfering of the joint part 4, the preferable chamfer range of the chamfered region 5 is determined in a way to be described in detail below with reference to FIGS. 4 and 5.

The wafers 1 are usually positioned by rotating them while the peripheries of the wafers 1 are held in touch with a roller 6. Herein, the phenomenon is exploited in which, when the orientation flatness 2 of the wafer 1 has moved up to the roller 6, the wafer 1 stops rotating due to this orientation flatness being the flat portion.

When the circular periphery of the wafer 1 is in touch with the roller 6, the wafer 1 is rotated along with the rotation of the roller 6. With the orientation flatness 2, however, even when the wafer 1 and the roller 6 lie in touch, the turning effort of the roller 6 does not contribute to the rotation of the wafer 1. Thus, in spite of the rotation of the roller 6, the wafer 1 stops rotating and moving and holds its state.

Figure 4:
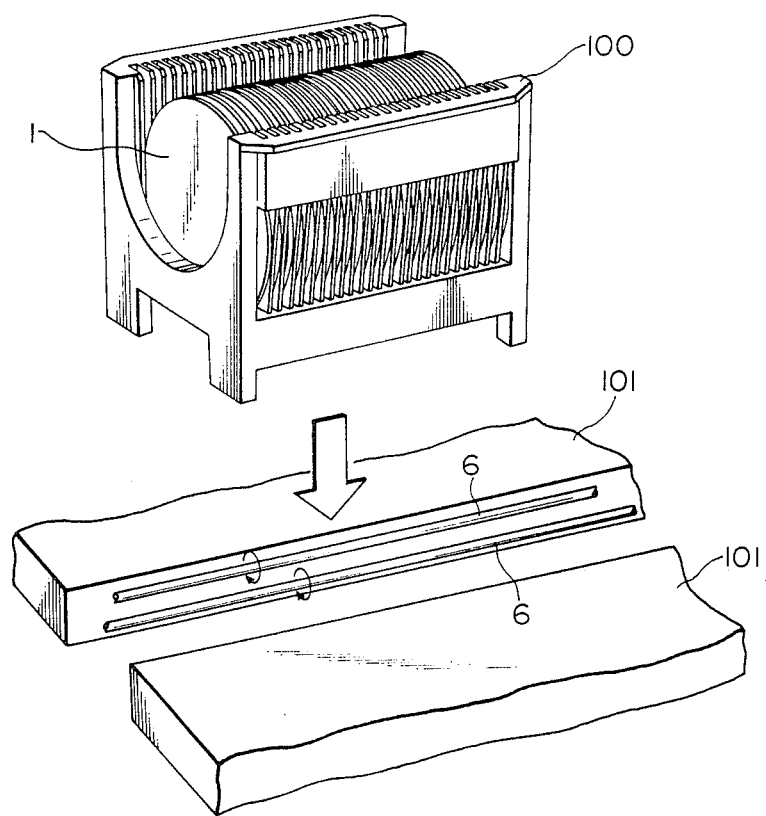
FIG. 4 is an explanatory view for illustrating the positioning of wafers.

As shown most clearly in FIG. 4 a wafer jig 100, receiving a large number of wafers 1, is placed on a positioning rest 101 which has two rollers 6. When the rollers 6 are subsequently rotated, the wafers 1 received in the wafer jig 100 start rotating. When the orientation flatness portions 2 of the respective wafers have moved up to the positions of the rollers 6, the wafers 1 do not rotate any longer and such a state is established for all the wafers 1. Eventually, all the wafers 1 are aligned in the state in which the orientation flatness portions 2 of the respective wafers 1 are located on the lower side.

In executing such positioning, regulation or alignment of the wafers 1, these are various methods other than the aforementioned one, such as, for example, a method employing a single roller 6 and a method resorting to optical means composed of photoelctric elements etc.

Figure 5:
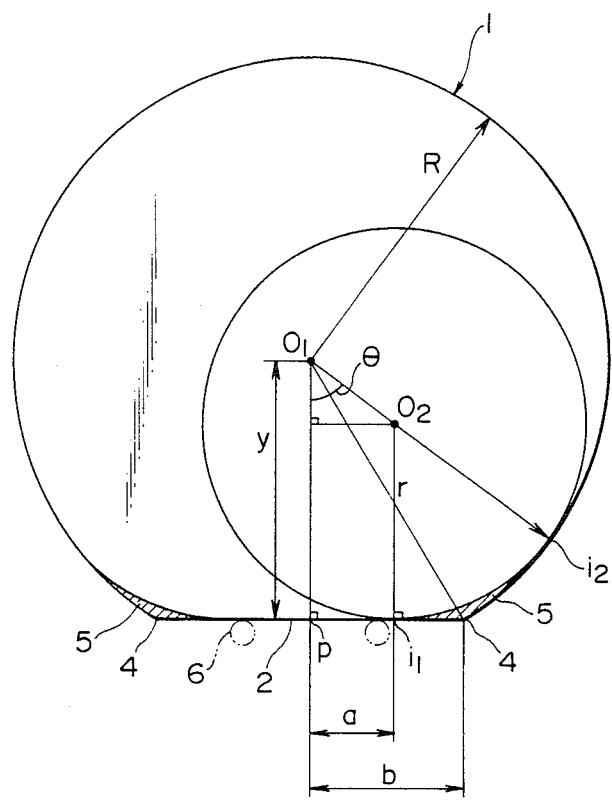
FIG. 5 is a plan view for explaining the determination of chamfer regions in the wafer shown in FIGS. 1 to 3.

Referring to FIG. 5, a wafer 1 havig a width W has a radius R, and its center is $O_1$. The distance from the center $O_1$ to the orientation flatness 2 of the wafer is denoted by $y$. When a perpendicular is drawn from the center $O_1$ down to the orientation flatness 2, the point of intersection P is supposed to be the middle point of the orientation flatness 2. The reference character $b$ represents a distance between a point of a half of the full length of the orientation flatness 2 before the chamfer, namely, the point P and a joint part 4 formed by the orientation flatness 2 and the contour of the wafer 1.

It is stipulated in SEMI standards that the relationship between the length of the orientation flatness 2 as well as the width W of the wafer 1 and the diameter D=2R of the wafer 1 becomes as indicated in Table 1 with the mirror wafe state.

TABLE 1

| | Diameter of Wafer | | | |
|---|---|---|---|---|
| | 3 inches | 100 mm | 125 mm | 150 mm |
| Allowable Range of Diameter [mm] | 75.56–76.84 | ±1 | ±1 | ±1 |
| Width [μm] | 360–410 | 500–550 | 600–650 | 650–700 |
| Length of Orientation Flatness | 19.05–25.40 | 30–35 | 40–45 | 55–60 |

On the other hand, since the wafers 1 need to be positioned by utilizing the orientation flatnesses 2, the orientation flatness 2 has that length of the flat portion which must be possessed, at the minimum, for accurate positioning. Letting a denote the half of such length, the length a is the distance from the point P to the point of inscription $i_1$ between a common inscribed circle and the orientation flatness 2. As noted above photoelectric elements, etc. other than the roller 6 may well be used as the positioning means.

Letting $i_2$ denote the point of inscription between the common inscribed circle and the contour of the wafer 1, the center $O_2$ of the common inscribed circle lies on a straight line whih connects the center $O_2$ of the wafer 1 and the point of inscription $i_2$. The angle between the straight line and the straight line $\overline{O_1P}$ is expressed by $\theta$.

Accordingly, the radius $\underline{r}$ of the common inscribed circle which is inscribed to both the contour of the wafer 1 and the orientation flatness 2 is obtained as stated below.

First, the minimum required length for the positioning by the rollers 6, namely, the length $\underline{a}$ ($a = \overline{Pi_2}$) of that flat portion in the orientation flatness 2 which is not chamfered is given by:

$$a = (R-r)\sin\theta \quad (1)$$

Secondly, the length $\underline{y}$ of the perpendicular $\overline{O_1P}$ drawn from the center $O_1$ of the wafer 1 to the orientation flatness 2 is given by:

$$y = (R-r)\cos\theta + r \quad (2)$$

From a right-angled triangle $O_1P4$, $y^2 = R^2 - b^2$ holds. Therefore, $$y = \sqrt{R^2 - b^2} \quad (3)$$

Substituting Equation (3) into Equation (2), $$\sqrt{R^2 - b^2} = (R-r)\cos\theta + r \quad (4)$$

$$\cos\theta = \frac{\sqrt{R^2 - b^2} - r}{(R-r)}$$

From Equation (1), $$\sin\theta = \frac{a}{(R-r)} \quad (5)$$

Since $\sin^2\theta + \cos^2\theta = 1$, Equations (4) and (5) yield:

$$\frac{a^2}{(R-r)^2} + \frac{(\sqrt{R^2 - b^2} - r)^2}{(R-r)^2} = 1 \quad (6)$$

Putting Equation (6) in order, $$r = \frac{b^2 - a^2}{2(R - \sqrt{R^2 - b^2})} \quad (7)$$

Accordingly, in the present embodiment, the chamfer region 5 in the joint region 4 between the contour of the wafer 1 and the orientation flatness 2 may be worked along the circular arc of any radius as long as this circular arc is the arc of the common inscribed circle or radius $\underline{r}$ in Equation (7) or falls within a region outside it, as indicated by oblique lines in FIG. 5.

That is, the radius $\underline{r}$ of the inscribed circle common to both the contour line of the wafer 1 and the orientation flatness 2 may lie within a range given by the following expression, and the joint part 4 may be arcuately chamfered within the range of radius $r$:

$$r \leq \frac{b^2 - a^2}{2(R - \sqrt{R^2 - b^2})} \quad (8)$$

On the other hand, the minimum value of the radius $r$ in the chamfering can be set as stated below.

As shown in FIG. 3, the silicon wafer 1 according to the present invention has the peripheral parts of both its major surfaces chamfered. The dimensions of the chamfering, namely, the length A of a slant face portion and the length B of an end face portion are stipulated from experimental values. It was experimentally determined that the lengths B of the chamfer end face portion differs depending upon the width W of the wafer 1. It has been experimentally found that when the length B is at most 0.32 mm (320 $\mu$m) and at least 0.15 mm (150 $\mu$m) for W of 0.4 mm, the chipping of the peripheral part of the wafer exhibits the minimum value. It has also been found that the chipping of the peripheral part of the wafer exhibits the minimum value when 150 $\mu$m $\leq$ B $\leq$ 420 $\mu$m for W=0.5 mm and when 150 $\mu$m $\leq$ B $\leq$ 520 $\mu$m for W=0.6 mm. That is, the chipping of the peripheral part of the wafer is minimized when the length B of the chamfer end face portion in the wafer periphery is at least 150 $\mu$m and, at most, a value obtained by subtracting 80 $\mu$m from the wafer width W. In other words, the chipping falls within the range of 150 $\mu$m $\leq$ B and B $\leq$ (W−80) $\mu$m. Thus, in the chamfer dimensions of the silicon wafer 1 according to the present invention, the length B of the end face portion is set by the following expression, whereby the breakage and chipping of the wafer 1 attributed to mechanical shocks etc. during the processing of transportation of the wafer extraordinarily decreases:

$$150 \ \mu m \leq B \leq (W-80) \ \mu m \quad (9)$$

On the other hand, the length A of the slant face portion in the chamfer dimensions of the silicon wafer 1 according to the present invention is experimentally set to be at least 0.2 mm (200 $\mu$m), whereby the breakage and chipping of the wafer 1 attributed to mechanical shocks etc. during the processing or transportation of the wafer can be extraordinarily reduced.

In view of the above and as shown in FIG. 3, the peripheral parts of both the major surfaces of the semiconductor wafer may be chamfered. Herein, the chamfering dimensions as to the sectional shape of the wafer may be such that the length B of the chamfer end face portion is set at a value within the range not smaller than 150 $\mu$m and not greater than the value obtained by subtracting 80 $\mu$m from the width of the wafer, while the length A of the chamfer slant face portion is rendered at least 200 $\mu$m.

Accordingly, the radius $r$ of the inscribed circle common to both the contour of the wafer 1 and the orientation flatness 2 may fall within a range given by the following expression, and the joint part may be chamfered arcuately within this range of radius $r$:

$$\frac{W - B}{2} \leq r \quad (10)$$

From Expressions (8) and (10), the chamfering radius $r$ may lie within a range given by the following expression:

$$\frac{W - B}{2} \leq r \leq \frac{b^2 - a^2}{2(R - \sqrt{R^2 - b^2})} \quad (11)$$

where
 $r$ = radius of the wafer chamfering circle,
 $R$ = radius of the wafer,
 $a$ = half of the length of the unchamfered portion (flat portion) in the wafer cut-away portion,
 $b$ = half of the full length of the wafer cut-away portion before being chamfered,
 $W$ = width of the wafer, and
 $B$ = length of the wafer end face portion.

In this manner, the wafer 1 according to the present invention is chamfered in the peripheral parts of the sliced silicon wafer with the predetermined dimensions and is thus smoothed so as not to protrude the corners, so that a breaking off or chipping of the wafer is prevented. Moreover, even when there is an impact on the wafer 1, here is no local concentration of a load therefore the strength of the peripheral part of the wafer increases, and the quantity of the chipping of the peripheral part can be extraordinarily reduced. Accordingly, it is possible to avoid the problem of silicon chips floating in the air as dust and the adhering of the chips to the surface of the silicon wafer; therefore in the wafer processing for producing a semiconductor device a photoresist film in a photolithographic process can have the external appearance of its surface enhanced and a lowering of its resolution prevented, and favorable vapor growth etc. free from any abnormal epitaxial growth can be effected. Further, since the chamfering dimensions are adapted to relieve the crowns and fringes of the photoresist and to enhance the resolution thereof, various patterns can be formed on the wafer by fine working.

According to the present invention, no acute corner or bend exists in the joint region between the contour of the wafer 1 and the orientation flatness 2. Therefore, it is possible to prevent a break off in the joint region breaks off and development of chipping due to, for example, the collision against the guide of an air bearing or contact with another wafer during the transportation of the wafer 1. In addition to the defect of the foreign matter due to the appearance of chip pieces, it is also possible to significantly reduce defects such as, for example, inferior transportation due to acute corner hitches on the guide of the air bearing, etc., and an inferior thickness of a resist film attributed to of the a partial dispersing of resist film due to the turbulence of an air current in the acute corner during the application of the resist. This is especially favorable for wafers of large diameter.

Figure 6:
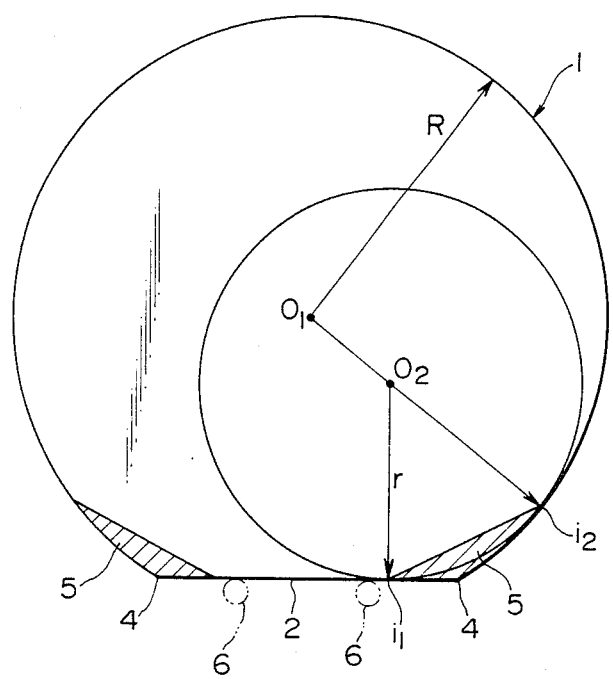
FIG. 6 is a plan view of another embodiment of the wafer according to the present invention.

As shown in FIG. 6, the joint parts 4 between the contour of a wafer 1 and an orientation flatness 2 are rectilinearly chamfered within the ranges of chamfer regions 5 indicated by oblique lines. The maximum chamfer range of the chamfer region 5 is defined by a straight line which connects the points of inscription $i_1$ and $i_2$ of an inscribed circle common to both the contour of the wafer 1 and the orientation flatness 2, as explained before with reference to FIG. 5. The radius $r$ of the common inscribed circle can be selected within the same range as indicated by expression (11).

Also in FIG. 6, there is no acute corner or bend in the joint part 4 between the contour of the wafer 1 and the orientation flatness 2, so that the defect of the foreign matter due to the appearance of chipping pieces, the defect of the transportation, the defect of the thickness of a resist film, etc. can be sharply reduced.

The chamfering according to the present invention may be in any shapes other than the arcuate and rectilinear shapes in the foregoing embodiments, such as various curved shapes and polygonal shapes insofar as the shapes can remove acute corners.

Figure 7:
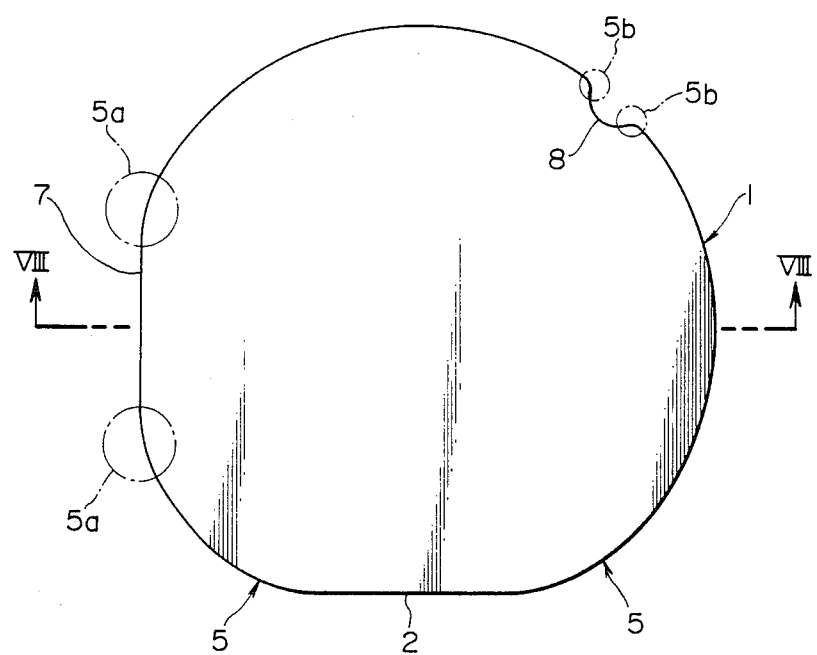
FIG. 7 is a plan view showing still another embodiment of the present invention.
Figure 8:
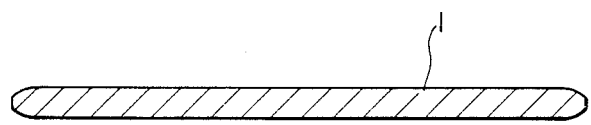
FIG. 8 is a sectional view taken along line VIII—VIII in FIG. 7.
Figure 9:
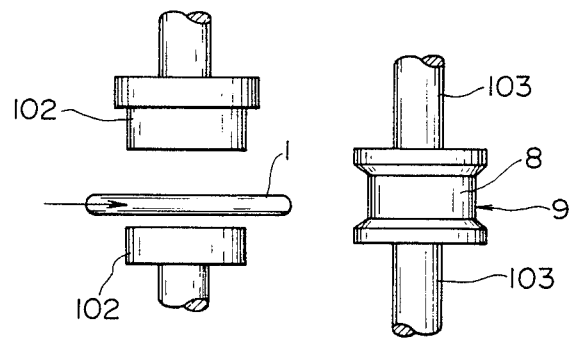
FIGS. 9 to 17 are schematic views showing three examples of chamfering devices which can be used for performing a method of working a wafer according to the present invention.
Figure 10:
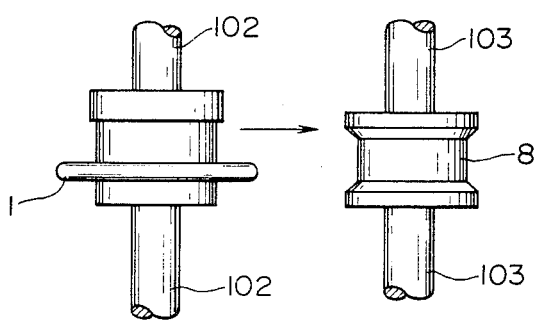
Figure 11:
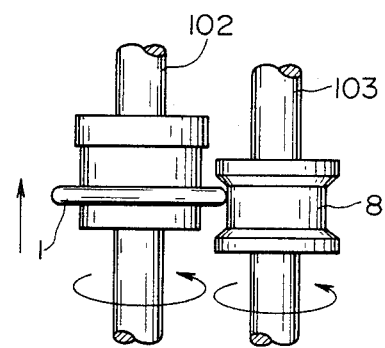
Figure 12:
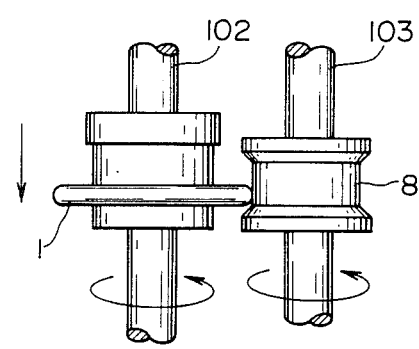
Figure 13:
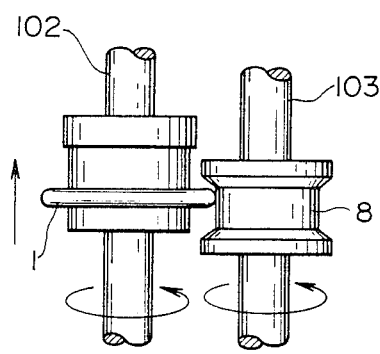

The present invention is applicable, not only to providing the principle flatness or the orientation flatness, but also providing a sub flatness or a second flatness. More particularly, as illustrated in FIGS. 7 and 8, the chamfer regions 5 of the joint regions between both the ends of the orientation flatness 2 and the contour of the wafer 1 are chamfered, and, as in ranges indicated by symbol 5a, also the joint regions between both the ends of the second flatness 7, and the contour of the wafer 1 are chamfered along the arcs of common inscribed circles inscribed to both the second flatness 7 and the contour of the wafer 1 or along straight lines connecting the points of inscription of the common inscribed circles, or in the regions outside them.

Further, the present invention is applicable to a case where, besides the flat portions such as the orientation flatness 2 and the second flatness 7, a curved positioning notch 8 is formed in the wafer 1. In this case, the joint regions between both the ends of the positioning notch 8 and the contour of the wafer 1 may be chamfered along the arcs of common inscribed circles inscribed to both the positioning notch 8 and the contour of the wafer 1 or along straight lines connecting the points of inscription of the common inscribed circles, or in the regions outside them, as in ranges indicated by symbol 5b.

The chamfering of the present invenion may well be performed simultaneously with the formation of the orientation flatness 2, or with the chamfering of the outer peripheral part 3 in the thickness direction. Such simultaneous chamfering is very favorable in point of the job efficiency, but separate chamfering may well be performed. Of course, the present invention does not always require the chamfering of the outer peripheral part 3 of the wafer 1 in the thickness direction.

Examples of chamfering devices for carrying out the necessary chamfering in the wafers described above are illustrated in FIGS. 9 to 13, so-called shape profiling type. While a grindstone 81 having a rectilinear groove 9 is rotated, it is moved in the horizontal direction and the vertical direction to perform a chamfering operation. The grindstone 81 can also perform the chamfering of the outer peripheral part of a wafer 1 in the thickness or width direction. The chamfering device, also includes a chuck mechanism 102 for the wafer 1, and numeral a chuck mechanism 103 for the grindstone 81 which are respectively adapted to rotate and move vertically and horizontally.

Figure 14:
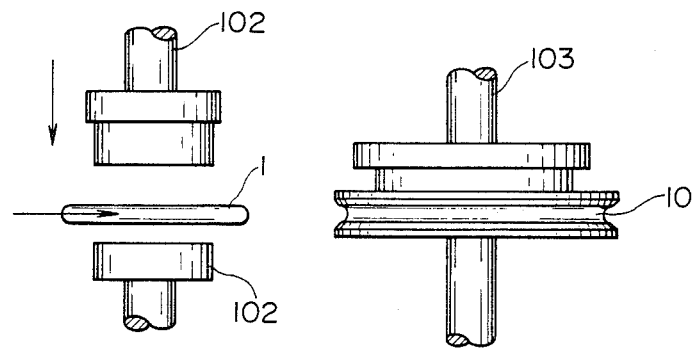
Figure 15:
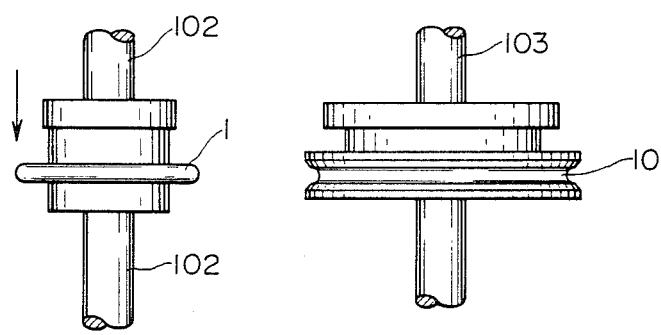
Figure 16:
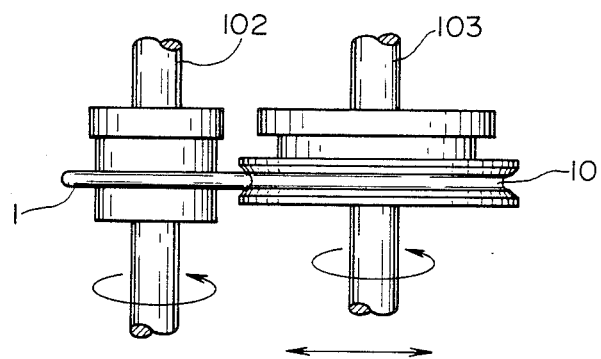

FIGS. 14 to 16 provides an example of a so-called shape transfer type chamfering device. While being rotated, a grindstone 10, having a curved grove 11 which is conformed to the shape of the chamfering of the outer peripheral part of the wafer 1 in the thickness direction, is moved in a horizontal direction. Thus, an outer peripheral part of the wafer 1 can be chamfered as shown in FIGS. 1 to 3. Additionally, the chamfer regions 5, 5a and 5b shown in FIGS. 5 to 8 can be chamfered.

In this manner, the chamfering devices in FIGS. 9 to 16 can perform both the chamfering of the chamfer regions 5, 5a, 5b and that of the outer peripheral part of the wafer 1. Therefore, these mechanical chamfering operations can be efficiently be performed at the same time, though they may well be executed individually.

Figure 17:
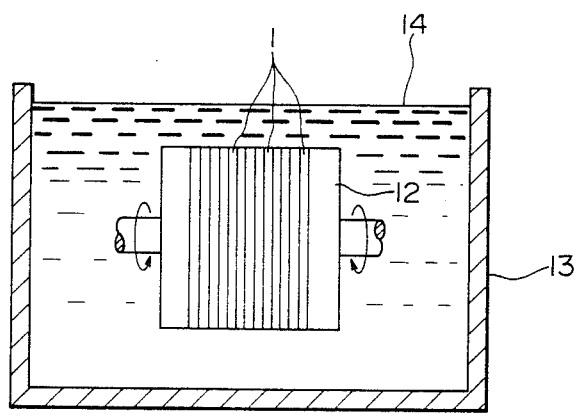

FIG. 17 provides an example of a chamfering device wherein a rotary supporter 12, in which a large number of wafers 1 are sandwiched, is immersed in a liquid etchant 14 (for example, a solution having a composition which consists of fluoric acid, nitric acid and glacial acetic acid at a volumetric ratio of 2:5:3) contained in an etching bath 13. While being rotated along with the rotary supporter 12, the wafers 1 have their outer peripheral parts etched by the liquid etchant 14. In this case, in order to chamfer only the chamfer regions 5, 5a and 5b, the other outer peripheral parts of the wafers 1 need to be masked so as not to touch the liquid etchant 14. However, the corners of the whole outer peripheries may well be chemically chamfered in the thickness direction by the liquid etchant after the chamfer regions 5, 5a and 5b have been formed by mechanical grinding in advance. In the case of FIG. 17, mechanical shocks on the wafers 1 can be relieved.

The present invention is not restricted to the wafers made of silicon (Si), but is also applicable to wafers made of germanium (Ge) or various compound semiconductor materials such as gallium arsenic (GaAs) and gallium garnet.

As set forth above, according to the present invention, no acute corner or bend exists in the joint regions between the contour of the wafer and the cut-away portion of the wafer such as a removed portion for positioning. It is therefore possible to remarkably reduce defects ascribable to the existence of acute corners or bends, such as the defect of a foreign matter due to the chipping of the wafer, the defect of transportation and the defect of the thickness of a resist film.

What is claimed is:

1. A wafer for forming an integrated circuit thereon, the wafer comprising a substantially circular contour portion, at least one substantially flat portion for defining a crystal orientation, and connecting portions, disposed between the circular contour portion of the wafer and respective ends of the at least one substantially flat portion, and wherein the connecting portions are chamfered in a thickness direction thereof and in a plane parallel to a major surface thereof to form curvilinear contours so as to prevent a chipping of the wafer at the connecting portion during a processing thereof.

2. A wafer according to claim 1, wherein the wafer is of a substantially single crystal.

3. A wafer according to claim 1, wherein said wafer includes a semiconductor material as a main component thereof.

4. A wafer according to claim 3, wherein the semiconductor material is Si.

5. A wafer characterized in that joint regions between a contour of the wafer and a cut-away portion thereof are chamfered in a thickness direction thereof and in a plane parallel to a major surface thereof wherein the chamfering is performed in the plane parallel to a major surface of the wafer curvilinearly along inscribed circles common to the wafer contour and the cut-away portion, and a radius of each inscribed circle is determined by the following expression:

$$\frac{W-B}{2} \leq r \leq \frac{b^2 - a^2}{2(R - \sqrt{R^2 - b^2})}$$

r = radius of the inscribed circle,
R = radius of the wafer,
a = half of a length of an unchamfered portion in a positioning removal portion,
b = half of a full length of the positioning removal portion before the chamfering,
W = width of the wafer, and
B = length of wafer and end face portion.

6. A wafer according to claim 5, wherein the wafer is of a substantially single crystal.

7. A method of working a substantially circular wafer for forming an integrated circuit thereon, the method comprising the steps of forming at least one substantially flat contour portion for defining a crystal orientation of the wafer, and chamfering connecting portions disposed between respective ends of the at least one substantially flat portion of the wafer at least ina plane parallel to a major surface of the wafer to form circular contours so as to prevent chipping of the connecting portions of the wafer during subsequent processing thereof.

8. A method of working a wafer according to claim 7, wherein said wafer includes a semiconductor material as a main component thereof.

9. A method of working a wafer according to claim 7, wherein the chamfering in the plane parallel to a major surface is performed simultaneously with chamfering of an outer peripheral part of the wafer in a thickness direction of the wafer.

10. A method of working a wafer, the method comprising the steps of forming a substantially flat portion in a contour of the wafer, and chamfering joint regions between respective ends of the substantially flat portion of the wafer and the contour of the wafer, wherein the chamfering is performed curvilinearly along inscribed circles in an area common to said outer contour of the wafer and said substantially flat portion.

11. A method of working a wafer characterized by forming a cut-away portion of the wafer in a contour thereof, and chamfering joint regions between the wafer cut-away portion and the resulting wafer contour and in a plane parallel to a major surface thereof, wherein the chamfering in a plane parallel to a major surface is performed curvilinearly along inscribed circles common to said wafer contour and said wafer cut-away portion, and a radius of each inscribed circle is determined by the following expression:

$$\frac{W-B}{2} \leq r \leq \frac{b^2 - a^2}{2(R - \sqrt{R^2 - b^2})}$$

where:
r = radius of the inscribed circle,
R = radius of the wafer,
a = half of the length of an unchamfered portion im the wafer cut-away portion,
b = half of a full length of the wafer cut-away portion before the chamfering,
W = width of the wafer, and
B = length of a wafer end face portion.

12. A method of fabricating an integrated circuit, the method comprising the steps of:
providing a substantially circular wafer, forming at least one substantially flat contour portion for defining a crystal orientation of the wafer, chamfering connecting portions of the substantially circular contour of the wafer disposed between respective ends of the at least one substantially flat portion of the wafer and the substantially circular contour of the wafer at least in a plane parallel to a major surface of the wafer to form curvilinear contours so as to prevent chipping of the connecting portions of the wafer during subsequent processing thereof, and forming an integrated circuit on the processed wafer.

13. A method for fabricating an integrated circuit according to claim 12, wherein the step of chamfering is carried out by mechanical means.

* * * * *

UNITED STATES PATENT AND TRADEMARK OFFICE
CERTIFICATE OF CORRECTION

PATENT NO. : 4,783,225

DATED : November 8, 1988

INVENTOR(S) : Hisashi MAEJIMA; Hiroshi NISHIZUKA; Susumu KOMORIYA; a nd Etuo EGASHIRA It is certified that error appears in the above-identified patent and that said Letters Patent is hereby corrected as shown below:

Column 9, line 22, change "ina" to --in --.

Signed and Sealed this

Fourteenth Day of June, 1994

Attest:

BRUCE LEHMAN

Attesting Officer

Commissioner of Patents and Trademarks